United States Patent [19]

Mathis

[11] Patent Number: 5,370,737
[45] Date of Patent: Dec. 6, 1994

[54] VACUUM TREATMENT APPARATUS COMPRISING ANNULAR TREATMENT CHAMBER

[75] Inventor: Reinhard Mathis, Balzers, Austria

[73] Assignee: Balzers Aktiengellschaft, Switzerland

[21] Appl. No.: 997,362

[22] Filed: Dec. 28, 1992

[30] Foreign Application Priority Data

Dec. 27, 1991 [CH] Switzerland ............... 03 851/91-1

[51] Int. Cl.⁵ .......................................... C23C 16/50
[52] U.S. Cl. ............................ 118/723 E; 118/729; 118/730; 156/345; 204/298.28
[58] Field of Search .............. 118/723 E, 729, 730; 156/345; 204/298.28

[56] References Cited

U.S. PATENT DOCUMENTS

| | | | |
|---|---|---|---|
| 3,856,654 | 12/1974 | George | 204/192 |
| 3,892,198 | 7/1975 | Dobson | 118/48 |
| 4,849,250 | 7/1989 | Dee et al. | 204/298.28 X |
| 4,938,858 | 7/1990 | Zejda | 204/298.25 |
| 5,026,469 | 7/1991 | Kunkel et al. | 204/298.28 X |

FOREIGN PATENT DOCUMENTS 0254205  1/1988  European Pat. Off. .
2241634  3/1973  Germany .

*Primary Examiner*—R. Bruce Breneman
*Assistant Examiner*—Jonathan D. Baskin
*Attorney, Agent, or Firm*—Evenson, McKeown, Edwards & Lenahan

[57] ABSTRACT

A vacuum treatment apparatus for workpieces includes an annular treatment chamber having inner and outer surrounding walls and top and bottom walls. A carrier for a multitude of workpieces is provided. The carrier is arranged in a carousel-like manner in the annular treatment chamber. A drive mechanism linked to the carrier, drives the carrier. At least one part of at least one of the walls may be opened to open the annular treatment chamber for charging and discharging. The at least one part is of such an extent so as to allow charging and discharging with a plurality of the multitude of workpieces simultaneously.

30 Claims, 9 Drawing Sheets

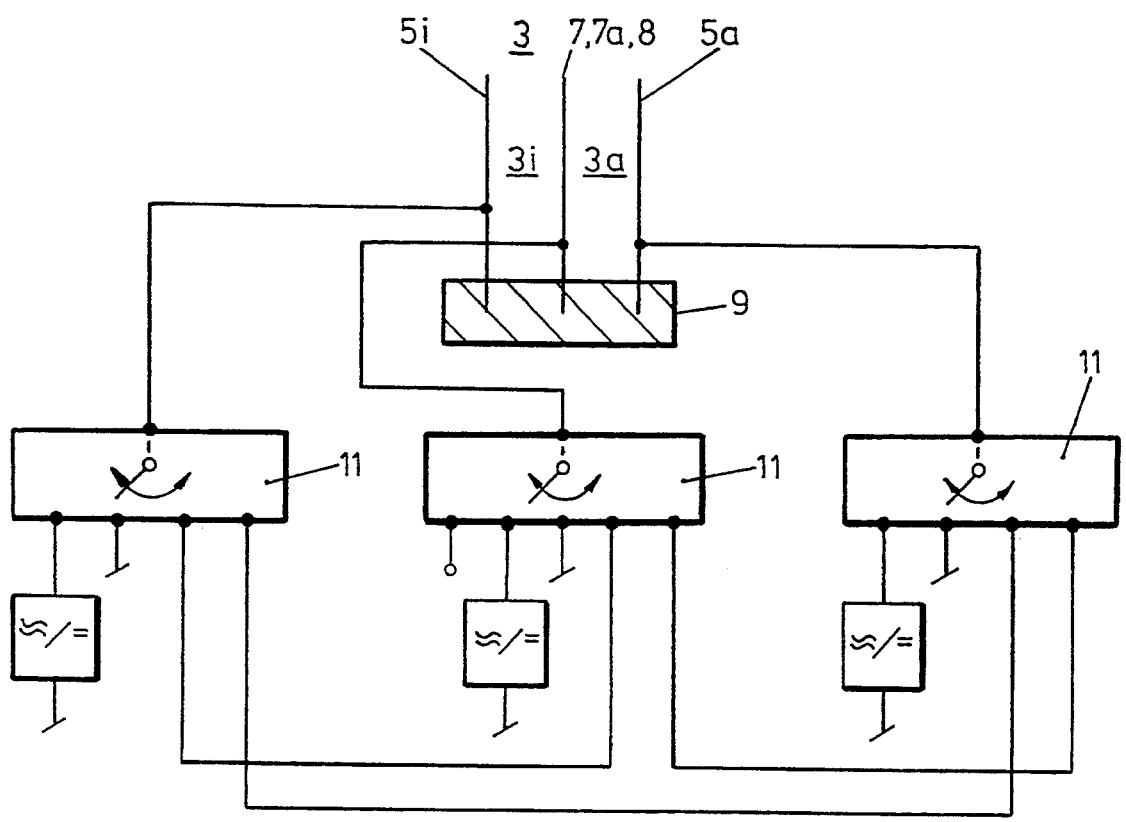
FIG.3
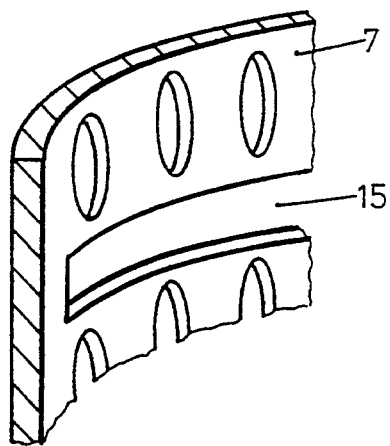
FIG.4 a)
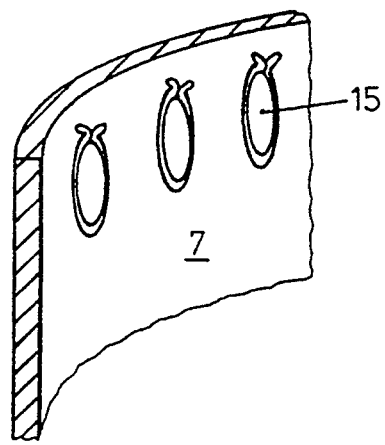
FIG.4 b)
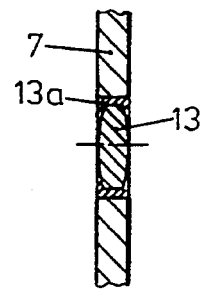
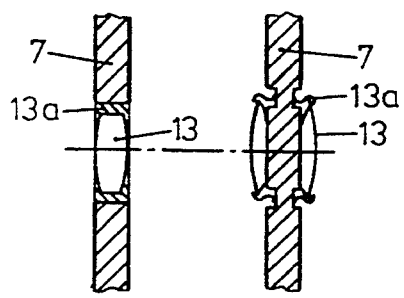

VACUUM TREATMENT APPARATUS COMPRISING ANNULAR TREATMENT CHAMBER

BACKGROUND OF THE INVENTION

1. Field of the Invention

The present invention is directed to a vacuum treatment apparatus for workpieces. More specifically the present invention is directed to a vacuum treatment apparatus for workpieces wherein a physical vapor deposition (PVD)-treatment or a chemical vapor deposition (CVD)-treatment or a plasma enhanced chemical vapor deposition PECVD or other hybrid treatment processes are performed.

2. Description of Prior Art

It is common to perform such vacuum treatment processes within vacuum chambers which define a unitary three-dimensional space, unitarily in all three dimensions and limited with respect to these three dimensions by respective walls.

Due to the arrangement of electrodes for plasma discharge, of gas inlet arrangements, as encountered especially for performing reactive treatment processes, and further of carriers for the workpieces etc. at distinct loci within such unitary chambers, it is difficult to fulfill the requirements of homogeneous treatment conditions for a multitude of workpieces to be simultaneously treated thereby additionally exploiting the volume of such chamber optimally by charging the highest possible number of such workpieces to be simultaneously treated to the chamber. In such known chambers and, dependent on the treatment process, to different extents, there occurs a gradient of treatment effect throughout the treatment chamber so that, in other words, a homogeneous equal treatment effect may only hardly be reached along substantial parts of such chamber volume.

From the German laid open document No. 22 41 634 which corresponds to the U.S. Pat. No. 3,856,654 a vacuum treatment apparatus is known with a treatment chamber for workpieces which is defined as an annular treatment chamber. The workpieces are supported at a cylindrical carrousel like and rotatable carrier arrangement within the annular treatment chamber. The workpieces are charged and discharged to the annular treatment chamber with a movement parallel to the axis of the chamber and are, workpiece by workpiece, fed to the carrier arrangement or removed therefrom. This is achieved by the action of a charging and discharging elevator which acts on the carrier at a predetermined fixed angular position of the carrier.

A drawback of this technique which is based on the principle of "first in, first out" is that a homogeneous undisturbed and steady treatment effect on the workpieces with which the annular chamber is charged may only hardly be realized primarily due to the disturbing effects due to the repeated charging and discharging operation for single workpieces at a predetermined angular position of the carrier.

It is further known from the U.S. Pat. No. 3,892,198 to provide a rotatably driven carrier bell for workpieces within a recipient of a vacuum treatment apparatus. The carrier bell is charged in that a substantial part of the cylindrical wall of the recipient is removable as a door. Thereby, the treatment chamber is not annularly which latter feature would only allow to minimize the volume of the treatment chamber for a predetermined number of workpieces to be simultaneously treated and to simultaneously realize an optimally uniform treatment effect along the entire pass of the workpieces as moved along the treatment chamber.

SUMMARY OF THE INVENTION

A general object of the present invention is to remedy the drawback of the known vacuum treatment apparatus discussed above.

This is realized by inventively providing a vacuum treatment apparatus for workpieces which comprises an annular treatment chamber and carrier means for a multitude of workpieces. The carrier means projects carrousel-like into the annular treatment chamber and is linked to drive means whereby the annular treatment chamber further comprises inner and outer, top and bottom walls surrounding the treatment chamber, at least one substantial part of said walls being removable to open the chamber for charging and discharging, respectively, said annular chamber with the multitude of workpieces.

By the fact that the inner space of the treatment chamber is annular and may additionally be opened along a substantial surface area so as to allow simultaneous charging and discharging of the chamber it becomes possible to treat all said multitude of workpieces, once charged to the treatment chamber, simultaneously and undisturbed up to the end of such treatment and especially continuously and free of accelerations. This allows optimally homogeneous and steady treatment. Even if in such a vacuum treatment apparatus the workpieces charged to the treatment chamber are moved in steps it is nevertheless possible to tailor acceleration and deceleration phases of the workpiece movement so that the resulting disturbing effects on homogeneous treatment become negligible. In that further the inventively provided treatment chamber is annular, an extended treatment chamber which is realized, due to its annular shape, abuses optimally few space and in which the workpieces "see" equal spacings as rotating along the annular treatment chamber.

It is still another object of the present invention to further improve the feature that each workpiece shall encounter and "see" the same spacings to adjacent walls of the treatment chamber as moved along said chamber. This is realized by defining the annular treatment chamber predominantly by two substantially cylindric and coaxial walls whereby said carrier means projects in said treatment chamber formed between the two cylindric walls.

Based on such a concept for the treatment chamber e.g. vacuum treatment apparatus' were realized with a diameter of the annular treatment chamber of more than one meter and with a radial extent of the annular treatment chamber in the order of centimeters, so as for instance with an extent of approximately 7 cm, dimensions which clearly reveal that an extended treatment chamber is realized along which the workpieces which encounter very accurately equal spacings from the inner and outer walls as moved along such chamber.

It is a further object of the present invention to further improve homogenity with which the workpieces moved along the treatment chamber are treated. This is realized by providing the annular treatment chamber along at least one inner and of the outer walls with a circular electrode surface extending along the annular treatment chamber for generating a plasma discharge in the chamber. Thereby and considering the azimithal extent of such a chamber, it becomes possible to generate homogeneously along such extent a plasma discharge in the treatment chamber be it between the inner and the outer walls, be it between the inner wall and the workpiece carrier means and/or between the outer wall and the workpiece carrier means.

It is a further object of the present invention to realize such inventive vacuum treatment apparatus for a plasma treatment of the workpieces. This is realized in that at least a part of the inner wall of the annular treatment chamber is connected to an rf-generator for generating a rf-plasma discharge in the treatment chamber. Thereby, the outer wall may be connected to a reference electric potential such as to a ground-potential.

It is a further object of the present invention to optimally exploit the space which is abused by such annular treatment chamber. This is realized by the apparatus comprising inside the inner wall means of the annular treatment chamber further arrangements of the apparatus as for instance drive means for the carrier means, pumping means, control means, etc.

It is still further an object to additionally improve homogenity of treatment which may be performed with the inventive vacuum treatment apparatus which is realized by driving means which provide for a continuous drive of the carrier means. Thereby and especially combined with providing plasma generating electrode surfaces surrounding the annular treatment chamber and as for a plasma enhanced vacuum treatment process, especially for a plasma polymerization process to be performed in the treatment chamber with one or two annular plasma discharge spaces, an optimally homogeneous treatment of one or more than one of the workpiece surfaces is reached. This is especially true in a preferred mode of the invention for a plasma enhanced chemical vapor deposition process PECVD as especially for plasma polymerization.

It is a further object to optimally exploit the volume of the annular treatment chamber to simultaneously treat a multitude of workpieces which is as large as possible. This is realized by defining by said carrier means a cylindrical surface which projects into the treatment chamber and by providing workpiece carriers being distributed along the cylindric surface. Thereby and at a given axial extent of the treatment chamber its volume is optimally exploited in that along such a cylindric surface defined by the carrier means, a multitude of workpieces to be simultaneously treated are arranged substantially between the bottom and the top of such annular chamber so that a large multitude of workpieces may be simultaneously treated on at least two sides equally or on at least two side differently or only on one selected side.

It is a further object of the present invention to improve flexibility of the inventive apparatus as concerning different treatments of workpieces which may be performed with one and the same apparatus. This is realized by providing the carrier means with workpiece carriers which are electrically isolated from other parts of the apparatus whereby preferably electrical source means are provided for selectively applying to such isolated workpiece carriers electrical potential. Such flexibility is also reached by providing workpiece carriers for the workpieces at that carrier means to be removable and exchangeable alternatively or additively to selectively applying electrical potential to said workpiece carriers.

A well known problem in vacuum processing is that of contamination by friction in the treatment chamber. It is thus a further object of the present invention to minimize the contamination. This is realized in that the central axis of the angular chamber is disposed substantially vertically whereby bearing means are provided for rotatably bearing the carrier means. The bearing means are disposed at the bottom side of the treatment chamber. Alternatively or additively, the driving means act on the carrier means at the bottom of the treatment chamber too.

Thereby it is assured that contamination particles generally and especial contamination due to friction of the driving means and/or of the bearing means will influence the workpiece treatment only to a insignificant extent if at all.

It is a further object of the present invention to provide optimal comfort for charging and discharging the annular treatment chamber with the multitude of workpieces. This is realized in that a substantial part of at least one of the bottom and/or top wall and/or the outer wall defining the annular treatment chamber is removable for charging and discharging the treatment chamber with the multitude of workpieces.

A further object of the present invention namely as was already mentioned, to optimally exploit the extent of the treatment chamber for treating as many as possible workpieces simultaneously is realized by providing the carrier means with several carrier rods being disposed substantially parallel to a central axis of the annular treatment chamber whereby each of these rods carries one or several workpiece carriers for respective workpieces each. Thereby the workpiece carriers are suspended to these rods so as on form several tree-like structures each with several workpieces.

It is a further object of the present invention especially to treat workpieces at the highest possible accuracy as for instance required for the treatment of optical devices with respect to utmost homogenity. This is realized by providing bearing means for rotatably bearing the carrier means. The bearing means are arranged centrally with respect to the annular treatment chamber. Thereby, preferably, the driving means act on the carrier means along its periphery i.e. remote from the central axis in or adjacent to the annular treatment chamber. Due to the driving means acting on the periphery of such carrier means there results a large driving radius for such carrier means with respect to the central axis and its rotational bearing and thus an optimally acurate control of the rotational movement of such carrier means.

It is a further object of the present invention to optimize rotational bearings of the carrier means. In view of the fact that it shall be possible to realize a large diameter of the annular treatment chamber and further a high accuracy of movement control of the carrier means so as to move the carrier means along the treatment chamber at presently predetermined and constant radial distances from respective inner and outer wall means and further with precisely predetermined distances to other parts of the treatment chamber, especially small distances in the range of a few millimeters according to dark space distance in plasma operation, it is evident that the technique for rotationally bearing the carrier means is of high importance.

This is considered by comprising at the inventive apparatus first bearing means for radially bearing the carrier means. The first bearing means is disposed centrally around a central axis of the annular treatment chamber. A second bearing means for axially bearing the carrier means is disposed radially outwards of the first bearing means or vice versa, i.e. by clearly separating radial bearing and axial bearing locally.

Thereby preferably the driving means are arranged so as to act on the carrier means centrally with respect to the central axis of the annular treatment chamber or radially distant from the axis whereby the driving means form a part of the bearing or resting means for the carrier means.

By means of this separation between radial pivoting bearing and axial bearing a very accurate control of the movement is realized without much expenditure for constructing the carrier means in such a manner that it fulfills the requirements with respect to the accuracy at least during an entire treatment process.

It is a further object of the present invention to ensure that, e.g. thermal loading of the carrier means, will not lead to such deformations thereof that the accuracy of the movement of the work pieces along the treatment chamber is impaired. This is realized by providing the carrier means with a rotatable carrier plate made of such a material and/or of such a structure that it is elastically deformable. Thereby in a preferred embodiment the carrier plate has a spoked structure and rests on bearing means along its periphery.

By such a realization of the carrier means for instance with spokes which are for instance elastic perpendicularly to the plane of the carrier plate, i.e. in axial direction, it is reached that especially combined with a central radial bearing, the carrier plate will optimally adapt to the peripherally provided axial bearings. Thus, in this peripheral area of the carrier plate where parts of the carrier means protrude into the annular treatment chamber, a very accurate control of the movement of the workpieces is achieved and especially constant distances of the carrier means with all its added parts with respect the chamber walls and with respect to other installations during movement of the carrier means. By such a technique, the maintenance of dark space distances in the order of 3 mm is realized even for annular treatment chamber diameters and thus of the carrier means and especially of the carrier plate of at least one meter.

It is a further object of the present invention to provide the drive of the carrier means within the annular treatment chamber as simply structured as possible. This is realized by having the drive means for the carrier means acting via a driving wheel, on the carrier means. Thereby in a preferred embodiment, the drive means acts at the bottom side of the treatment chamber on a peripheral region of the carrier means with such a driving wheel.

As it was mentioned above it is a further object of the present invention to reach utmost flexibility for performing various treatments in one and the same inventive apparatus. This is realized by electrically isolating workpiece carriers of the carrier means from other parts of the apparatus and especially with respect to parts of the inner and/or outer walls acting as plasma discharge electrodes, so that according to a desired treatment, these three parts namely electrode surfaces at the outer wall means, electrodes surfaces at the inner wall means and the workpiece carrier may be electrically driven by selected electrical potential independently from each others. Thus, the workpiece carriers may, e.g., be driven at the same electrical potential as one of the electrode surfaces extending along respective inner and/or outer wall means or the work piece carriers may be at floating potential especially for rf-plasma enhanced treatment and thereby especially for plasma polymerization treatment with mf or rf.

Thus, at least part of at least two of the inner walls and of the outer walls which define the annular treatment chamber and of the carrier means for the workpieces are electrically mutually isolated so as to allow respective electrical potential to be applied independently to such parts so as to generate a single plasma discharge between parts at the inner wall and parts at the outer wall or a single plasma discharge between parts at the inner wall and parts at the carrier means or a single plasma discharge between parts at the outer wall and parts at the workpiece carrier or and especially two annular plasma discharges between parts at the inner wall and parts at the outer wall, both with respect to parts at the carrier means.

It is a further object of the present invention to provide the inventive apparatus for coating treatment especially of optical devices, for which the highest demands with respect to homogenity of the coating must be fulfilled and which often have to be coated on at least two of their sides. This is achieved by providing means for holding the workpieces whereby the means for holding the workpieces are movable along the annular treatment chamber substantially with equal distance from the inner wall and from the outer wall defining the angular treatment space. It thereby becomes possible to plasma treat both surfaces of such optical devices directed radially inwards and respectively outwards in substantially equal plasma-discharges.

For realizing two annular plasma-discharges so as, e.g., for coating optical devices as lenses on two of their flat sides equally or differently, at least parts of the carrier means which protrude into the annular treatment chamber are made of an electro conductive material and are coupled to a reference potential. Another possibility is to provide such parts of the carrier means to be electro conductive and to bias the parts on a predetermined electrical potential thereby disposing the electrode surfaces along the inner and outer walls on equal or on different reference potentials. If the workpieces shall be operated at a floating electrical potential as especially for rf-plasma treatment, the parts at the workpiece carriers are made of electrically insulating material. In such a case, such parts are tailored so that the plasma-discharge may transit through the cylindric carrier means between the inner and the outer walls. Thus, in such a case the protruding parts of the carrier means shall form a grid-like structure or are constructed, as distinctly protruding carrier rods.

Nevertheless, it is possible to inventively provide along the annular treatment chamber not one homogenious and steady treatment but to provide at distinct loci, distinct treatments stations so, e.g., sputtering stations and/or evaporation stations and/or heating and/or sputter-edging stations.

It is a further object to provide the inventive apparatus as a coating apparatus for the workpieces.

Still a further object of the present invention is to provide an apparatus wherein the workpieces are substantially flat optical workpieces simultaneously treated on at least both of their flat sides.

It is still a further object of the present invention to provide an apparatus wherein the workpieces are substantially flat optical workpieces being simultaneously and substantially equally treated on both of their flat sides. In a mostly preferred embodiment, the apparatus is an apparatus for plasma-polymerization-coating treatment of optical workpieces.

BRIEF DESCRIPTION OF THE DRAWING

The present invention will be better understood and objects other than those set forth above will become apparent when consideration is given to the following detailed description thereof. Such description makes reference to the annexed drawings wherein:

FIG. 3 shows schematically and in a preferred embodiment the possibility of selectively applying to parts at the inner and at the outer wall of the inventive treatment chamber and to parts of the workpiece carrier, selectively, electrical potentials, FIG. 4a, b shows schematically embodiments of the carrier arrangement according to FIG. 2a with still schematically, positioning of workpieces onto or within such carrier means.

DESCRIPTION OF DIFFERENT EMBODIMENTS OF THE INVENTION AND OF THE PREFERRED FORM OF REALIZATION

Figure 1:
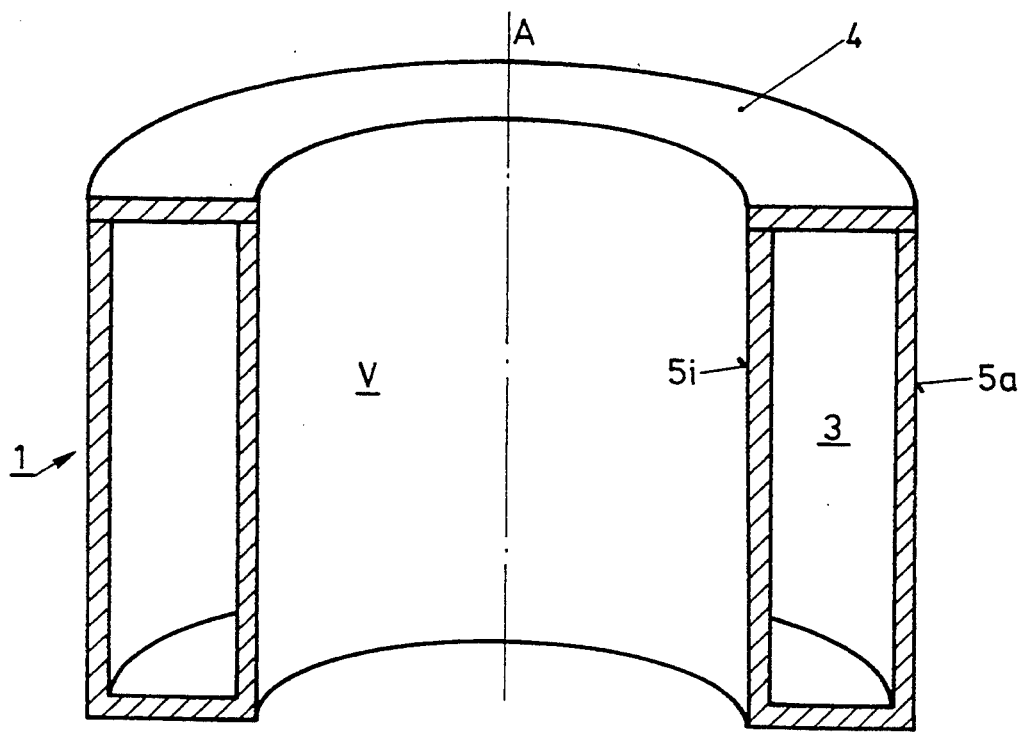
FIG. 1 shows schematically a treatment chamber according to the present invention, FIG. 2a, b shows a treatment chamber according to FIG. 1, with two preferred variants of workpiece carrier means in schematic form.

FIG. 1 schematically shows princiły a vacuum chamber 1 of an inventive apparatus. The treatment chamber or treatment space 3 is defined by an outer annular wall 5a and by an inner annular wall 5i. In a preferred embodiment and based on reasons which will be explained later, the chamber 1 with the coaxial walls 5a and 5i with respect to a central axis A, is disposed vertically.

It must be pointed out that especially the volume which is defined within the inner annular wall 5i, denoted with V, may be used for devices and means of the inventive vacuum treatment apparatus such as for pumping means, electrical control means, gas feeding means, etc.

According to FIG. 2a and 2b, again schematically, two sections out of an annular treatment chamber 1 are shown with two preferred carrier arrangements for workpieces 13 shown in principle. One of the embodiments of the carrier arrangement shown in FIG. 2a comprises a cylinder 7 which protrudes into the treatment space 3 between the inner and the outer annular walls 5i and 5a, respectively, with a predetermined radial distance therefrom. The carrier cylinder 7 is rotationally driven along the treatment space 3 in the treatment chamber 1 around a rotational central axis A.

Figures 2A, 2B:
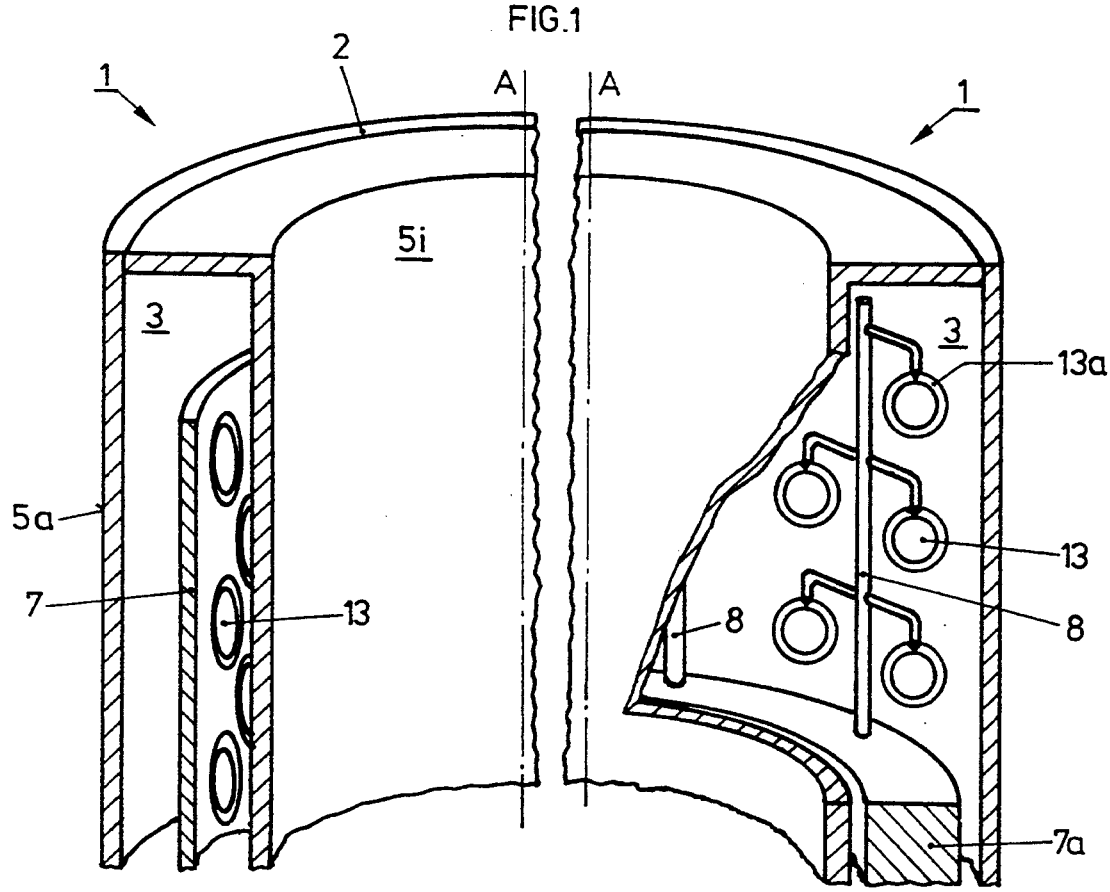

According to FIG. 2b, a second preferred embodiment of the carrier arrangement for the workpiece 13 comprises a carrier ring 7a on which rod shaped carrier arms 8 are mounted. The carrier arms 8 together define a cylindric surface. Along the carrier arms 8, workpieces 13 are disposed within respective workpiece carriers 13a. The carrier ring 7a and therewith the carrier arms 8 and the workpieces 13 are rotated along the treatment space 3 around the central axis A by drive means. The workpieces 13 are, as was mentioned, held by workpiece carriers 13a at the carrier cylinder 7 according to FIG. 2a and as well at the carrier arms 8 according to FIG. 2b whereby such workpiece carriers 13a may comprise springlike spanning rings.

Within the annular treatment chamber of the inventive apparatus provided with a carrier arrangement of FIG. 2a or 2b, different vacuum treatment processes may be carried out such as, for example, PVD processes, CVD processes and hybrid forms of such processes as well as etching processes, i.e. generally vacuum surface treatment processes.

FIG. 3 schematically shows the three electrically most important parts of and within the treatment chamber, namely inner wall 5i, outer wall 5a and workpiece carrier arrangement 7, 7a or 8 protruding between the walls. As is shown with the electrical isolation 9, those three parts or at least parts thereof are mutually electrically isolated. This allows the highest possible flexibility with respect to electrical operation of those three parts. This in turn is the basis to realize the inventive apparatus so as to be usable for different vacuum treatment processes. Each of the three annular surfaces shown in FIG. 3 namely outer wall 5a, inner wall 5i and the workpiece carrier may principally be considered as a three-electrode arrangement wherein the electrode surfaces may selectively be driven at desired electrical potentials. This is shown in FIG. 3 with the "option selectors" 11 which is not to be understood as real switching units, but are rather to be considered as graphical representations of different possibilities to apply to the of the three parts.

As may be seen the inner wall 5i may be driven with DC or AC-energy, up to the rf-region or even, as known to one skilled in the art, and with an appropriate layout, up to the microwave region. Simultaneously, the carrier arrangement according to 7, 7a or 8 may be operated on floating potential with the outer wall 5a on a reference potential. Alternatively, the carrier arrangement according to 7, 7a, or 8 may be driven together with the outer wall 5a on a reference potential.

Further the carrier arrangement according to 7, 7a or 8 may be set on a reference electrical potential thereby applying to the outer wall 5a a DC or AC potential again possibly up to the microwave region. In the last mentioned case, there are formed two so-called diode discharge spaces respectively between one of the walls and the carrier arrangement, which two discharge spaces may be operated equally or differently. If the carrier arrangement is operated on floating potential or is disposed on a selected biasing potential, this carrier arrangement is operated within one single discharge space between the inner and the outer walls. Departing from said possibilities, one skilled in the art clearly recognizes other possible combinations as to how the parts may be flexibly electrically operated according to a desired treatment to be performed at the workpieces on workpiece carrier arrangement 7, 7a, 8.

In FIGS. 4a, and 4b, two variants of a workpiece carrier cylinder 7 according to FIG. 2a are shown as a preferred embodiment of the carrier arrangement 7, 7a or 8.

According to FIG. 4a the workpiece carrier arrangement consists substantially of an electrically isolating material for the operation of the treatment chamber 3 according to FIG. 3 as one single, uniform discharge space. As is schematically shown at the bottom of FIG. 4a workpieces 13, e.g. optical lenses made of a plastic material, are held in holding spanners 13a on a plastic material carrier cylinder 7 so that these workpieces are accessible for treatment from two sides. Thereby significant parts 15 of the cylinder 7 are cut out so as to allow the discharge between the walls 5i and 5a to be operated. The construction of the carrier arrangement 7a, 8 according to FIG. 2b per se does allow such discharge.

According to FIG. 4b at least significant parts of the carrier cylinder 7 consist of electrically conductive material. Thereby it becomes possible to apply to the cylinder and thus to the workpieces 13 disposed along such cylinder any desired electrical potential and it becomes thus possible to operate the treatment space 3 as a twin chamber or as a unitary chamber between the annular walls 5i and 5a and the workpieces 13 disposed on bias potential or as a unitary chamber between one of the walls 5i or 5a and workpieces on the cylinder 7 disposed on reference potential, the latter operation being for the mono-sided treatment of the workpieces. With respect to the selection of the material (isolating material or electrically conductive material) and the electrical operation for the preferred realization form of the carrier means according to FIG. 2b, the same is valid.

As is shown at the bottom of FIG. 4b with electrically conductive cylinder 7, the possibility is given to arrange the workpieces 13 so as to be accessible for treatment from two sides, so as, e.g., to be plasma-enhanced coated, in differently operated treatment sub-spaces 3i and 3a according to FIG. 3, or to provide a double-sided treatment as a double sided plasma enhanced coating of the workpieces 13 in a unitary treatment chamber 3 according to FIG. 3 by operating the carrier cylinder 7 at electrically floating potential. Further, the possibility is given to provide the workpieces 13 disposed on the carrier cylinder 7 so as to treat in the two subspaces 3i and 3a according to FIG. 3 respectively a doubled number of workpieces simultaneously and monosided.

This too may be realized with a carrier arrangement with carrier arms 8 according to FIG. 2b in that the stable workpiece carriers 13a do also allow a one or double sided exposure of the workpiece surfaces.

As may be clearly recognized by the man skilled in the art, practically no limits are set to operate the inventive apparatus so as to perform any of the known plasma treatment procedures. Such flexibility is achieved by accordingly selecting the electrical operation and construction of the carrier arrangement 7, 7a, 8 and by accordingly selecting electrical operation of electrode surfaces at the walls 5a, 5i.

The annular chamber may thus be operated as double diode or single diode or triode arrangement, as a double diode arrangement especially for doublesided equal or different plasma polymerization of workpiece surfaces.

Further, the carrier arrangement may be operated with other treatment sources as an electrically biased arrangement with the workpieces thereon.

FIG. 5 again shows schematically a preferred embodiment of the recipient and of the treatment chamber 3. According to this embodiment, significant parts of the outside and of the inside walls 5a and 5i and of the carrier arrangement 7, 7a, 8 provide for electrode surfaces arrangements whereby the walls 5a and 5i provide for such electrode surfaces annularly surrounding the central axis A of the annular chamber 3. At the left hand side of FIG. 5, the single operated discharge space $E_T$ is shown in triode-operation and on the right hand side the two discharge spaces $E_{D1}$ and $E_{D2}$ are shown for a double diode operation.

Figure 5:
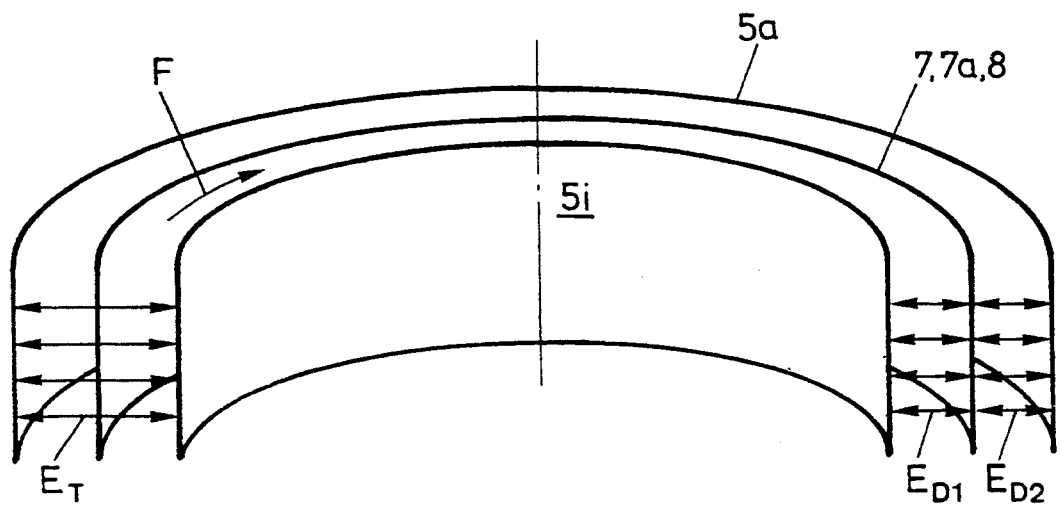
FIG. 5 shows schematically a part of an inventive treatment chamber with electrode-forming annular surfaces and with the carrier arrangement according to FIGS. 1, 2a, 2b for flexibly realizing different operating modes.

As has been mentioned above, and for achieving best possible homogenity of workpiece treatment, the carrier arrangement 7, 7a, 8 is rotatably moved between the walls 5i and 5a as is shown in FIG. 5 by the arrow F. This leads to the possibility according to FIG. 6 to provide these treatment stations 17 along the inner and-/or the outer wall 5i and 5a, as shown schematically in FIG. 6 along the outer wall 5a. Such treatment stations 17 may comprise sputter deposition sources, heating sources, etching sources, evaporation sources, arc evaporators, electron beam evaporators, etc.

Figure 6:
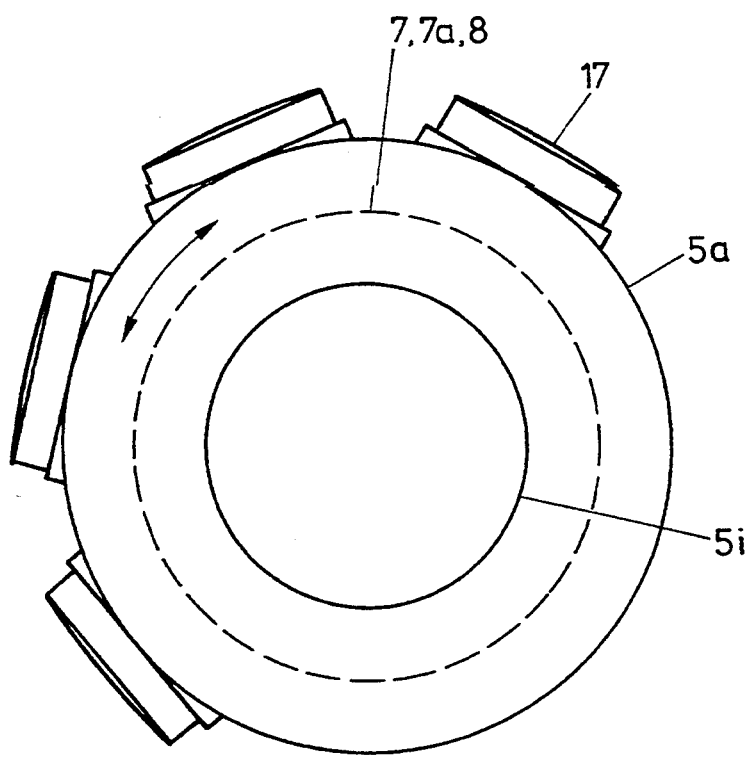
FIG. 6 shows schematically an inventive vacuum treatment apparatus with distinct treatment chambers mounted along the inventively provided annular treatment chamber.

In the embodiment according to FIG. 6 the workpiece carrier is intermittently rotated so that the workpiece carriers 7, 7a, 8 and the workpieces mounted thereon are sequentially moved from one treatment station 17 to the next. Thereby the characteristic of movement acceleration and deceleration may be selected so that intermittant movement does not disturb the respective treatments performed at the stations 17. On the other hand, the best possible homogeneity of treatment is realized in the best mode of realization of the present inventive apparatus by continuously and steadily rotating the workpiece carrier 7, 7a, 8 according to FIG. 5 by providing accordingly a continuous drive means.

Figure 7:
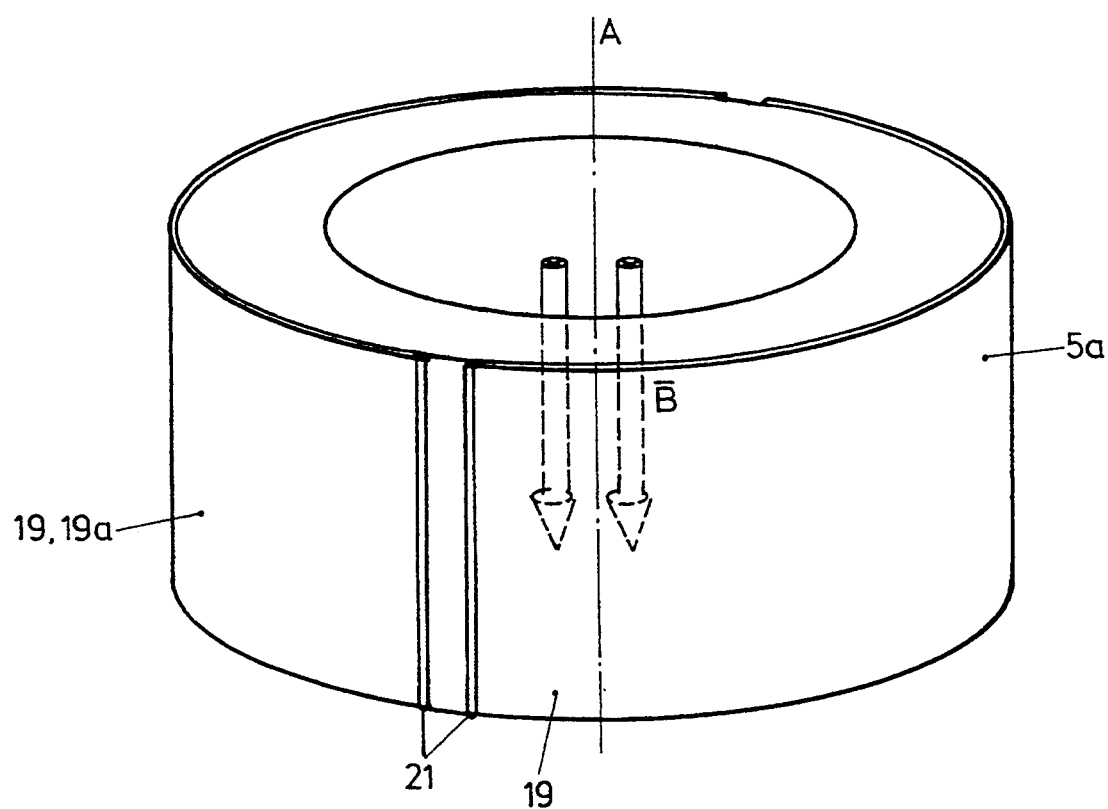
FIG. 7 shows a further embodiment of the annular treatment chamber.
Figure 8:
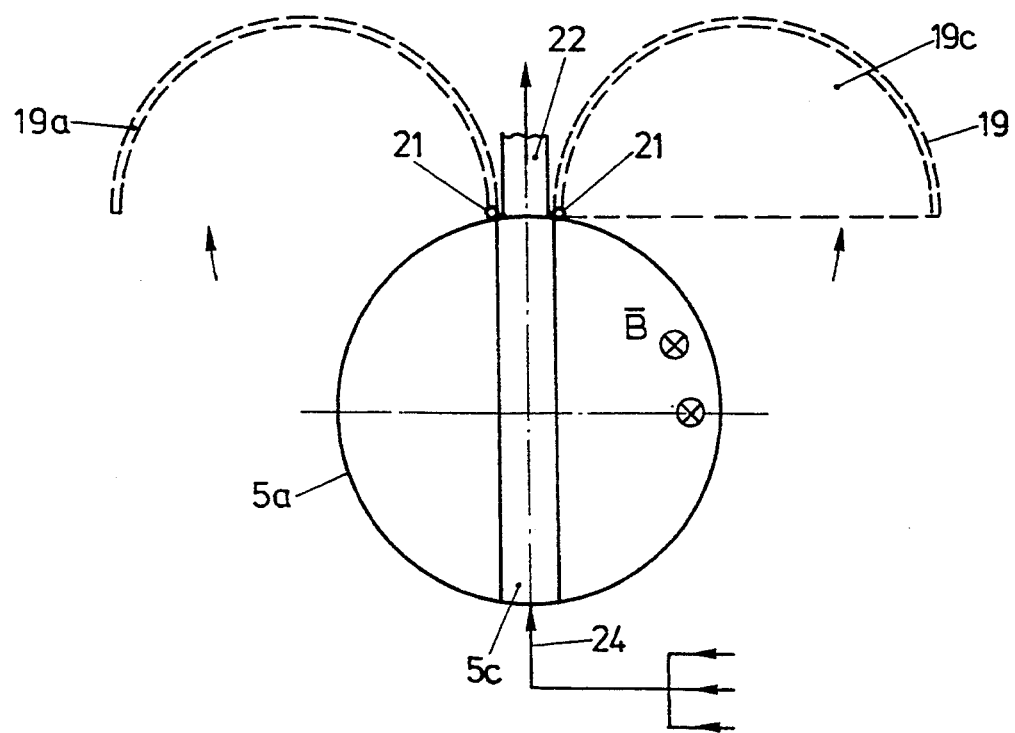
FIG. 8 shows schematically a top view of an inventive annular treatment chamber according to FIG. 7 in two different forms of realization with two kinds of discharge- and charging-doors and with further devices of the inventive apparatus and their connection to the treatment chamber.

In the FIGS. 7 and 8, a most important aspect of the inventive apparatus is shown, namely that the treatment chamber may be opened along a substantial part of its walls so as to charge or discharge the treatment chamber simultaneously with all the workpieces 13. In a first and preferred embodiment, the outer wall 5a is formed by at least one door 19 which is pivotable around an axis which is parallel to the central axis A of the annular chamber. As shown in FIG. 7, preferably two such doors 19, 19a are provided. Thereby it becomes possible to widely open the treatment chamber 3 be it to charge or discharge the chamber with the multitude of workpieces or be it for cleaning the treatment chamber.

As is shown in FIG. 8 in the top view representation, the preferably foreseen two doors 19, 19A may consist exclusively from parts of the annular wall 5a or may consist as is shown on the right hand side at 19 from such a parts of the outer wall 5a and additionally from parts of the bottom and/or top wall enclosing the annular treatment space. Between the two doors 19 or 19a a relatively small medium flange 5c of the outer wall 5a remains stationary at which, and as schematically shown in FIG. 8, further devices of the inventive apparatus are mounted so e.g. connections for a vacuum pump 22 for evacuating the treatment space or gas feeding lines 24 for a working or treating gas, as for argon or a reactive gas.

Figure 9A:
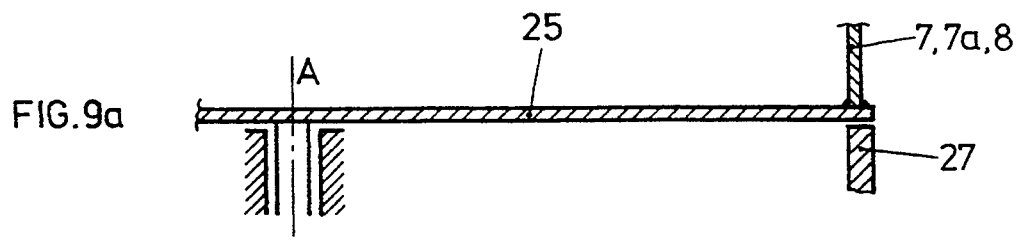
FIG. 9a, b shows schematically two preferred embodiments of bearings of workpiece carrier means at the treatment chamber.

In FIG. 9a a first preferred realization form of the pivot bearings of the workpiece carrier arrangement is shown. The carrier arrangement comprises a carrier plate 25 where a cylinder, as was described above namely a carrier cylinder 7 according to FIG. 2a or discrete carrier rods 8 according to FIG. 2b, is mounted along the periphery of the circular plate 25. Cylinder 7 or the carrier rods 8 may be removable from the carrier plate 25. The carrier plate 25 is mounted on radial bearings at the central axis A according to FIG. 9a on axial bearing surfaces. In a preferred embodiment, peripherial resting of the plate 25 occurs at least in part on a driving arrangement, so for instance on a driving wheel. Thus the rest 27 of FIG. 9a comprises in a preferred embodiment a driving wheel for driving the circular plate 25 in its radial bearing around the central axis A. Thus, the central bearing provides for pivotal movement and radial fixation of the plate 25 whereas the peripheral bearing at 27 provides for axial rest of plate 25.

Figure 9B:
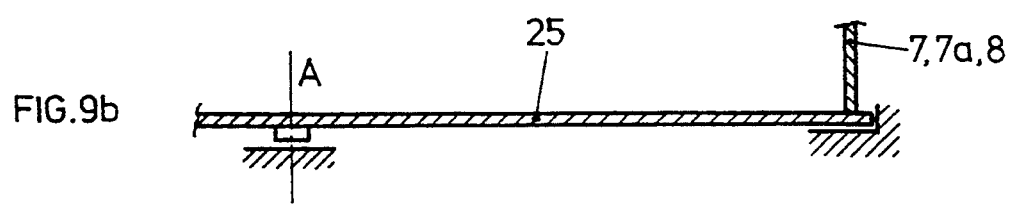

According to FIG. 9b the functions of central and peripheral bearings according to FIG. 9a are inversed. Here, the carrier plate 25 axially rests in its central area. At the periphery of the plate 25, bearing surfaces are foreseen to provide for a radial and pivotable bearing. By the preferred separation according to both FIGS. 9a and b of the radial bearing and of the axial bearing, it is reached that even large diameter plates 25 are mounted in a statically unambiguous manner and may be highly accurately moved. Deformations of the carrier plate 25 which may be caused by heat loading and would be considerable e.g. considered, at large diameter plates 25 with diameters of one meter or more, will not significantly and negatively influence movement control of the carrier arrangement 7, 7a or 8. By such bearing separation, a complicated and expensive construction of the carrier plate 25 itself is avoided which otherwise would be necessary to reach the required accuracy of workpiece movement during the workpiece treatment.

Figure 10:
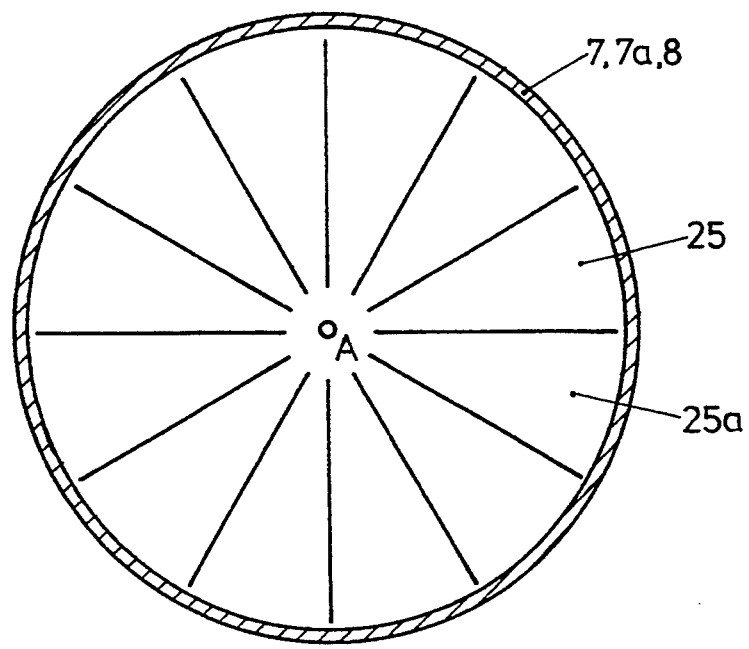
FIG. 10 shows schematically a preferred form of realization of a carrier plate of carrier means at the annular treatment chamber of the inventive apparatus.

FIG. 10 schematically shows a top view representation of a preferred construction of the carrier plate 25. To prevent possible deformations, so e.g. by heat loading, the plate 25 is made of such a material and/or so structured that it is elastically deformable in the direction of the central axis A. As may e.g. be seen from FIG. 9a, the peripheral area of the plate 25 is thereby permanently caused to rest by its proper weight on the bearing surfaces at 27. In a most simple manner to provide the elasticity, the carrier plate 25 has a spoked structure with spokes 25a which, combined with an appropriate material for such spokes and their dimensioning, leads to accurate abutment of the peripheral area of plate 25 along the axial bearings surfaces. Thereby extremely small dark space distances of e.g. three millimeters may stationarily be maintained during the movement of the carrier arrangement between parts of the surfaces of plate 25 and neighboring parts of the stationary enclosure of the treatment chamber: A mechanical wobbeling of the plate 25 is avoided.

Figure 11:
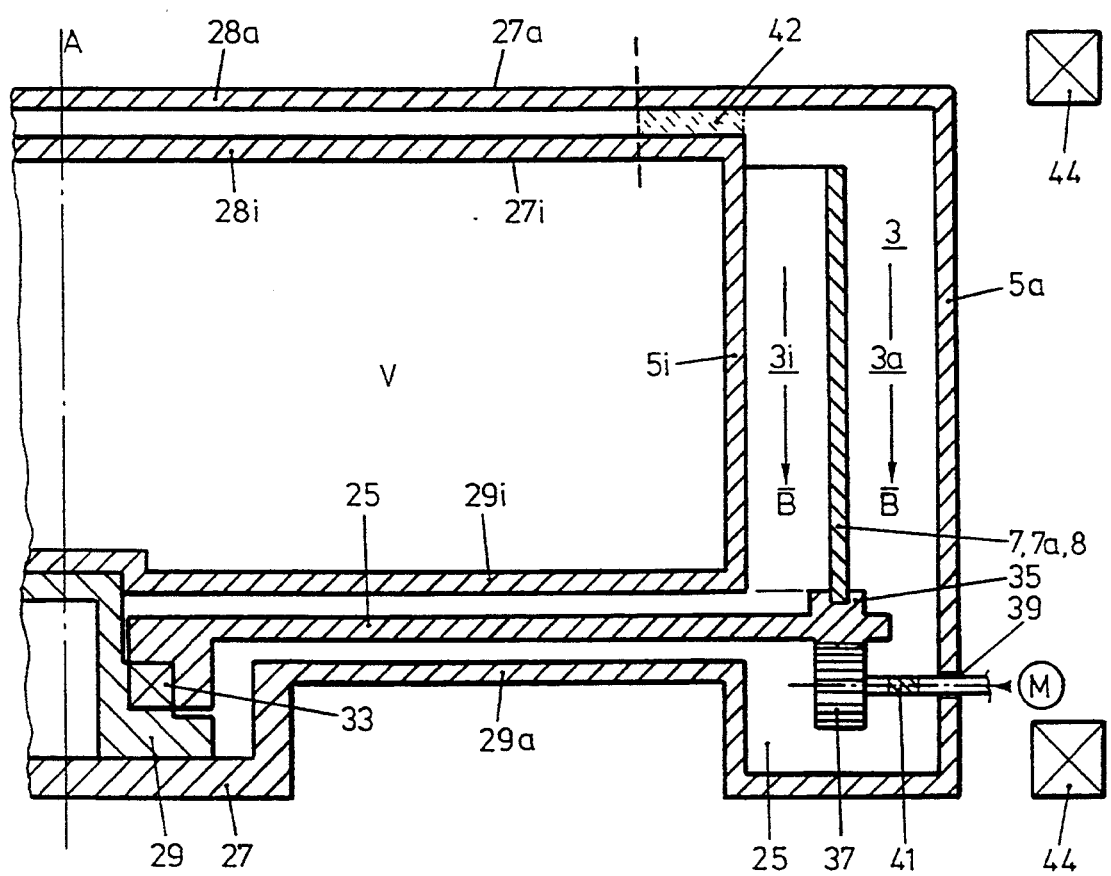
FIG. 11 shows schematically a sectional view of a preferred embodiment of an inventive apparatus.

FIG. 11 shows schematically in a cross sectional representation a first preferred embodiment of the inventive apparatus. Those parts which were described up to now are referred to in FIG. 11 with the same reference numbers. An annular treatment chamber 3 subdivided into the subtreatment chamber 3i and 3a is radially limited by annular inner wall 5i and annular outer wall 5a. The walls 5i and 5a are respectively formed by coaxial chambers 27i and 27a. The inner chamber 27i is separated from the outer chamber 27a by means of an electrical isolation 29.

The top wall plates 28i and 28a of the two chambers are separated by dark space distance. Between the bottom wall 29i and 29a of the chambers there is disposed the carrier plate 25. The carrier plate is pivotably mounted in radial bearings 33 and is distant from the neighboring plates 29i and 29a by dark space distances respectively. Along the periphery, the plate 25 carries according to FIG. 2a or 2b a carrier arrangement 7 or 7a, 8 which is preferable exchangeable. The periphery of plate 25 further rests on axial bearings thereby especially on a driving wheel 37 which latter is driven by a motor M the axis of which leading through a dynamic vacuum seal 39 to the wheel 37. The wheel 37 is electrically isolated by an isolator 41 from the motor M and the outer wall 5a or consists itself of isolating material. Obviously and preferably along the entire circumference of the plate 25, further axial resting or bearing surfaces are provided as e.g. bearing rollers. The carrier plate 25 is preferably construed as was shown and explained with respect to FIG. 10. With a motor M, the entire workpiece carrier arrangement is continuously and steadily driven or is incrementally driven in steps with selected acceleration and deceleration phases if discrete treating stations are provided as was explained in connection with FIG. 6.

As was explained in connection with FIGS. 7 and 8, the outer wall 5a of the chamber comprises preferably two doors. If it is desired to exploit the entire volume V within the inner wall 5i, then the top plates 28a and 28i are ommitted and instead of these plates the top end part of the walls 5i and 5a is electrically isolated and vacuum sealed as shown at 52.

Further, in the preferred embodiment Helmholz induction coils 44 are provided to generate through the treatment chamber 3 magnetic fields B substantially parallel to the central axis A if such magnetic fields are desired through the treatment chamber for a selected treatment process. The magnetic fields B are shown in FIG. 7 and 8 in one of the possible polarities.

It must be emphazised that the workpiece carrier cylinder 7 projecting between the inner and outer walls or that workpiece carrier rods 8 must not necessarily and as shown be disposed symmetrically i.e. at equal distances between the inner and outer walls. Depending from a desired treatment the carrier means and therewith the workpieces may be disposed and moved closer to one of the walls 5i, 5a than to the other. By the high accuracy of movement especially along the periphery of the plate 25 thereby maintaining dark space distance conditions with respect to the bottom plate 29a and 29i, there results that the workpieces are moved with high accuracy and with respectively given and constant distances from the walls 5i and 5a acting as electrode surfaces according to a desired treatment as was explained in connection with FIG. 3. The electrical operating means for the electrode surfaces at the inner and outer walls 5i and 5a and for the workpiece carrier arrangement 7 or 7a, 8 which parts are mutually electrically isolated according to the structure of FIG. 3, are not shown in FIG. 11.

Figure 15:
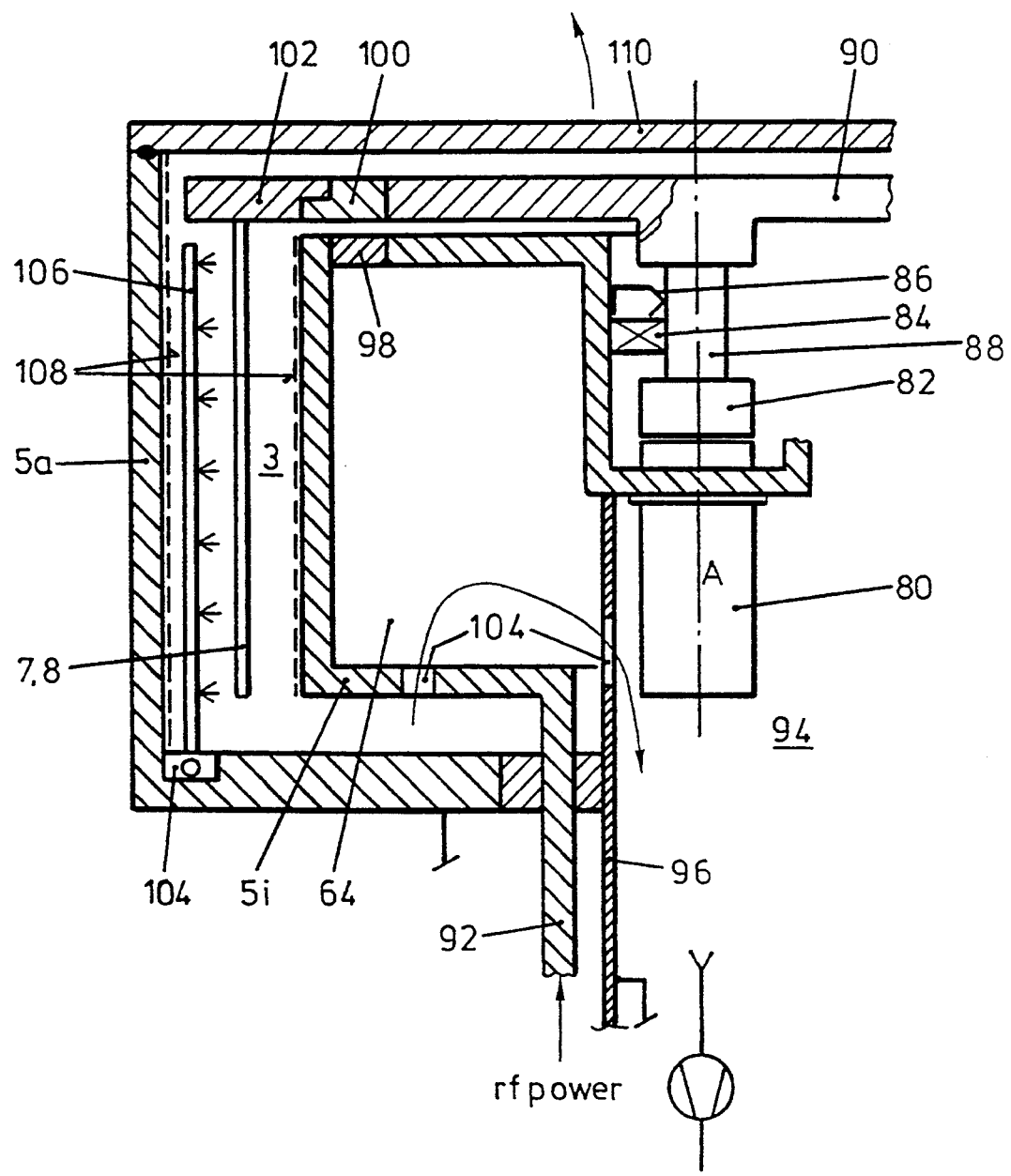
FIG. 15 shows schematically a sectional view through a part of a further embodiment of the inventive apparatus as the current best mode of realization.

FIG. 12 to 15 schematically show further embodiments of the inventive apparatus whereby that one of FIG. 15 shows the best mode of realization for rf-plasma treatment.

Figure 12:
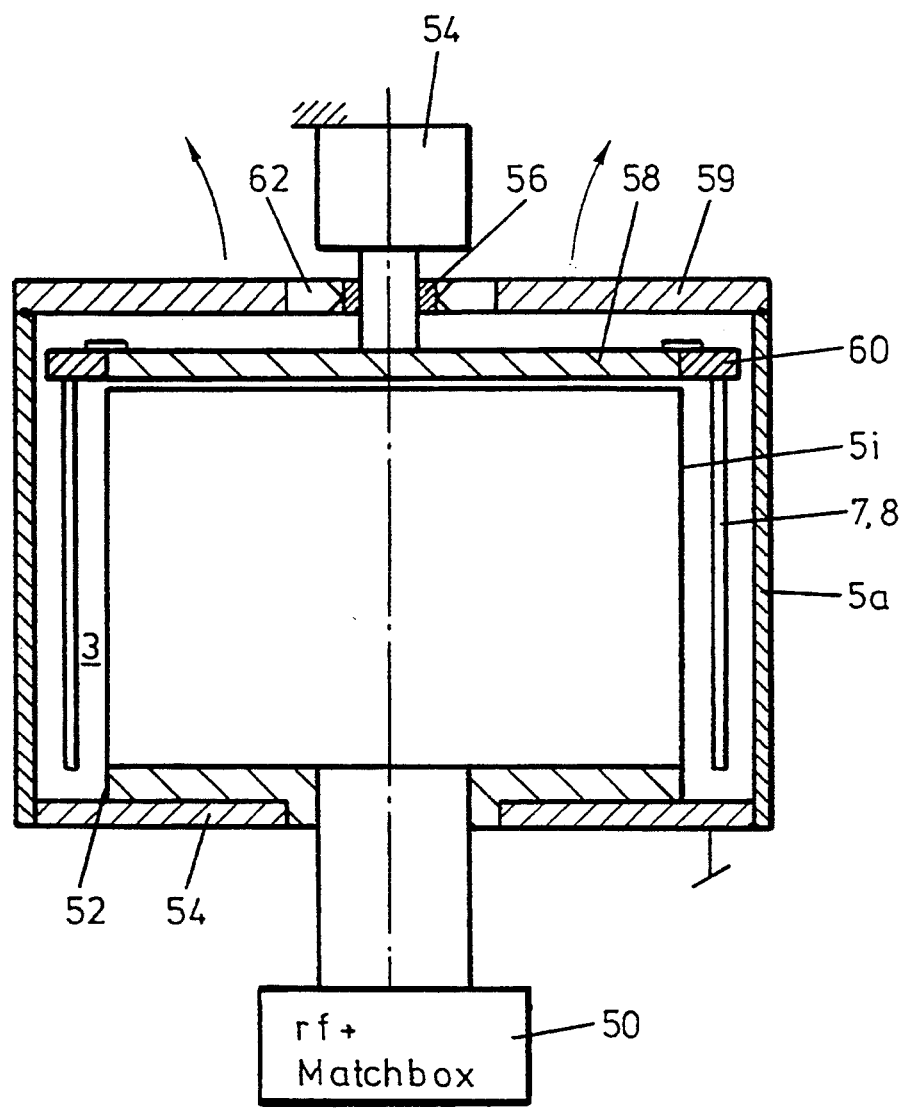
FIG. 12 shows schematically a sectional view through a further embodiment of an inventive apparatus.

The inner wall 5i according to FIG. 12 formes an rf-electrode surface and is connected to a match box and a rf-generator within an unit 50. The outer wall 5a also forms an electrode surface, and e.g. is driven at a reference potential namely at ground potential.

The radio-frequency electrode formed by at least a part of the inner wall 5i is electrically isolated by means of isolator 52 from the bottom plate 54 which is operated at the same electric potential as the outer wall 5a. By means of a motor 55 which is stationarily mounted by means of a flange 56 to the outer boardering wall of the treatment chamber 3, the carrier plate 58 is preferably continuously rotated. The carrier plate 58 is preferably made of a dielectric material.

A peripheral ring 60 is preferably removably linked along carrier plate 58. A carrier cylinder 7 or carrier rods 8 are mounted to the ring 60. For charging the treatment chamber 3, covers 59 are lifted as shown with the arrows in FIG. 12. The covers once closed are sealed to flange 56 by means of vacuum seals 62. As the covers 59 are lifted, the outer ring 60 is disposed on or removed from the periphery of the carrier plate 58 together with the multitude of workpieces on the carrier arrangement 7,8.

As may be seen, this structure leaves a minimum of dead space within the treatment space which is most advantageous with respect to cleaning of the treatment space. The treatment space 3 is further easily accessible and only one shaft sealing for the motor shaft 56 is necessary. In spite of the fact that according to FIG. 12 the workpieces are shown to be at floating electrical potential within the treatment chambers 3, it is absolutely possible to apply a biasing potential to the workpieces selectively a biasing.

Figure 13:
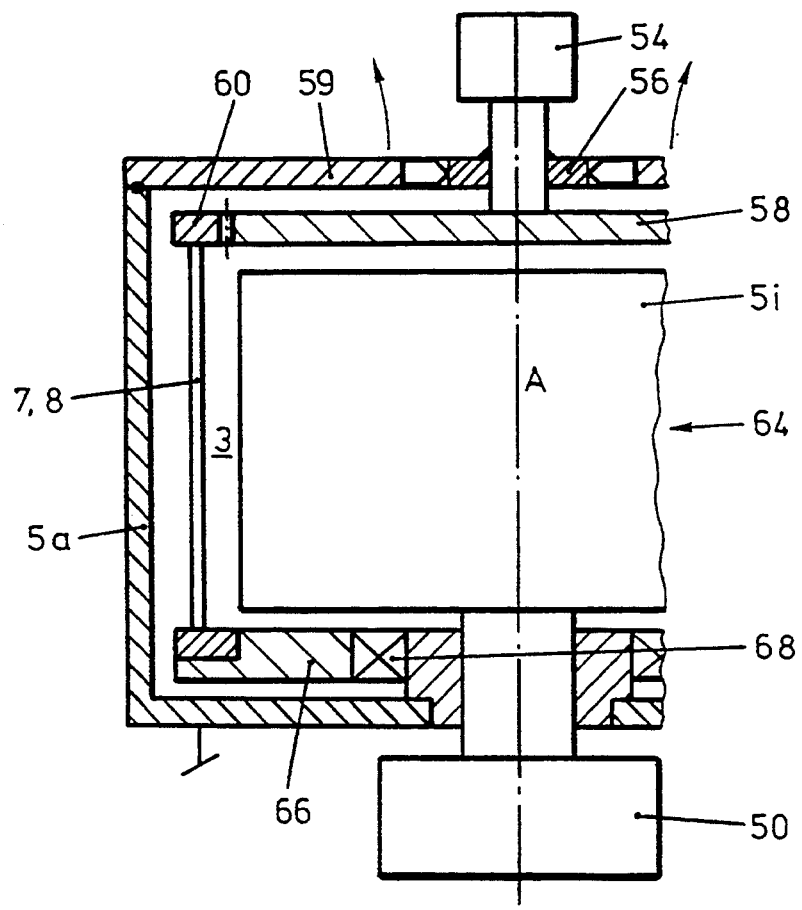
FIG. 13 shows schematically a sectional view through a part of a further embodiment of the inventive apparatus.
Figure 14:
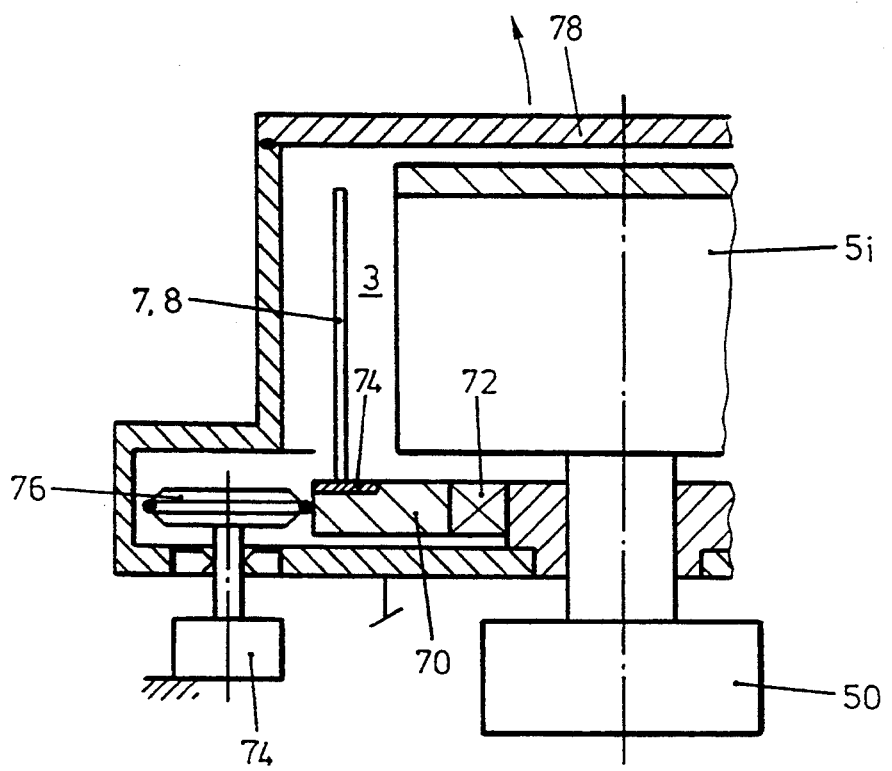
FIG. 14 shows a sectional view through a part of a still further embodiment of a inventive apparatus.

According to FIG. 13, the inner wall 5i of the treatment chamber 3 again forms the rf-electrode surface. The outer wall 5a again terminates in at least one removable cover 59. The motor 55 mounted to flange 56 acts on the carrier plate 58 which is preferably made of a dielectric material. An outer ring 60 is linked to the periphery of plate 58 so that rotational movement of plate 58 is transmitted to the ring 60. In axial direction i.e. parallel to central axis A, the carrier arrangement 7, 8 mounted to the ring 60 rests on a bottom plate 66 which is stationary in the axial direction and is provided with axial and radial bearings, e.g. with ball bearings 68. Thereby, the bottom plate 66 is rotatable with respect to an rf-feed through leading from a motor-box and rf-generator to the rf-electrode surface along the inner wall 5i.

Here again, surfaces of the rotatable carrier arrangement which are disposed close to the rf-electrode surface are preferably made of dielectric material. The driving action of the motor 55 acts via plate 58 azimithly on ring 60 and therefrom on the carrier arrangement 7,8 and on the bottom plate 66 whereon the carrier arrangement axially rests. Here too charging and discharging of the treatment space with the multitude of workpieces is performed by removing cover 59 and introducing or removing ring 60 with all the workpieces disposed thereon.

In FIG. 14, the inner wall 5i again forms the rf-electrode. The rf-electrode is connected via a feed through to match-box and generator unit 50. A bottom carrier plate 70, pivotably mounted in bearings 72 and axially fixed, carries the upstanding carrier arrangement 7 or 8 disposed as schematically shown on a peripheral ring 74. The plate 70 is driven by a motor 75 via a friction wheel 76. The treatment chamber 3 is closed as shown by the arrow by a removable cover 78 so that after that cover having been opened, ring 74 may be removed together with the entire carrier arrangement 7,8 and the treated workpieces to be replaced by another ring 74 with a carrier arrangement and workpieces to be treated.

FIG. 15 shows a best mode of realization of the inventive apparatus for rf-plasma-treatment up to now. Centrally with respect to axis A of the annular treatment space 3, there is provided a motor 80 to drive the carrier arrangement for the multitude of workpieces.

The motor 80 acts via a clutch 82 and an axle 88 disposed in bearing 86 on a carrier plate 90. The motor and the entire drive arrangement for the plate 90 are arranged centrally within the inner annular wall 5i. The annular wall 5i defines the rf-electrode and is thus connected to a feed through 92 and to a match box and rf-generator which are not shown in FIG. 15. The central cylindric area 94 of the overall arrangement with motor 80 and e.g. feeding and control lines thereto, is electrically screened by a screen cylinder 96 which is disposed on the same electrical potential as the outer electrode defined by the outer wall 5a.

The centrally disposed top part of the central core 64 carrying also the annular inner wall 5i is electrically isolated by means of isolator 98 from the radially outer parts of that core 64 which forms the outer wall 5i which defines the rf-electrode and which is thus loaded with rf-energy. The central or radially inner part of that core 64 is connected to the screen cylinder 96 and thus disposed on reference potential, i.e. on ground potential.

A carrier ring 102 rests along the periphery of carrier plate 90 along a electrical isolator 100. At the outer wall of the treatment space 3, comprising also the annular outer wall 5a a feed and distribution arrangement 104 for gas to be injected into the treatment space 3 is provided. Such a gas inlet and distribution system may as shown e.g. comprise upstanding shower-like gas distributing pipes 106 for introducing e.g. a reactive gas into the treatment space 3. Especially when workpieces shall be treated simultaneously on both radially opposite surfaces as e.g. and especially by plasma-polymerization, a reactive gas is preferably injected on both sides of the carrier arrangement 7,8 (not shown).

Connections for a vacuum pump for evacuating the treatment chamber 3 are preferably provided in the center of the overall arrangement i.e. coaxially to central axis A. Evacuation of the treatment space 3 occurs as schematically shown through respectively dimensioned openings 105.

Charging and discharging of the treatment space 3 is done by removing a cover 110 as was already described or by means of pivotable doors which were described in connection with the FIGS. 7 and 8. An important feature of the embodiment according to FIG. 15 is that the central area of the overall arrangement, and radially boardered by the inner wall 5i, is exploited to mount the drive arrangement for the carrier plate 90, pumping means and further devices of the apparatus. In all configurations shown of the inventive apparatus and as known to one skilled in the art if desired, magnetic fields are axially coupled into the treatment space 3 as was shown in connection with FIG. 11 by means of coils 44 and/or by means of permanent magnets possibly with pole shoes.

Further it is evident that as shown in FIG. 15 with dashed lines, the surfaces which are exposed to the treatment space 3 are provided with removable plates 108 which may be easily removed from the space 3 for cleaning. The best mode of realization according to FIG. 15 comprises Helmholz coils 44 according to FIG. 11 and the diameter of the annular treatment space is larger than one meter whereby the radial extent of the treatment space is in the range of a few centimeters, e.g. is approximately 7 cm.

I claim:

1. Vacuum treatment apparatus for workpieces, comprising:
   an annular treatment chamber comprising inner and outer surrounding walls and top and bottom walls;
   a carrier for a multitude of workpieces, said carrier projecting in a carousel-like manner into said annular treatment chamber;
   drive means, linked to said carrier, for driving said carrier;
   wherein at least one part of at least one of said walls may be opened to open said annular treatment chamber for charging and discharging, said at least one part being of such an extent so as to allow charging and discharging with a plurality of said multitude of workpieces simultaneously.

2. The apparatus of claim 1, wherein said inner and outer surrounding walls are cylindric and mutually coaxial.

3. The apparatus of claim 1, wherein said annular treatment chamber comprises along at least one of said inner and of said outer surrounding walls a surrounding electrode surface extending along said annular treatment chamber for the generation of a plasma discharge in said annular treatment chamber.

4. The apparatus of claim 1, wherein at least a part of said inner surrounding wall is connected to an rf-generator for generating an rf-plasma discharge in said annular treatment chamber.

5. The apparatus of claim 1, wherein inside said inner surrounding wall of said annular treatment chamber, a space is provided for arranging additional systems for said apparatus.

6. The apparatus of claim 5, wherein said further arrangements comprise at least one of said drive means and a pumping means.

7. The apparatus of claim 1, wherein said drive means provides for a continuous drive.

8. The apparatus of claim 1, wherein said carrier defines a cylindrical surface arranged in said annular treatment chamber, having a plurality of workpiece holders being distributed along said cylindrical surface.

9. The apparatus of claim 1, wherein said at least one part is a portion of said outer surrounding wall.

10. The apparatus of claim 1, wherein said at least one part is a portion of at least one of said bottom and top walls.

11. The apparatus of claim 1, wherein said carrier comprises several carrier rods being disposed substantially parallel to a central axis of said annular treatment chamber, each of said rods carrying one or several additional workpiece carriers.

12. The apparatus of claim 1, wherein said annular treatment chamber is arranged with its central axis disposed vertical and comprising bearing means for rotatably bearing said carrier, said bearing means being disposed at the bottom of said annular treatment chamber.

13. The apparatus of claim 1, wherein said annular treatment chamber is disposed with its central axis vertical and wherein said drive means act on said carrier at the bottom of said annular treatment chamber.

14. The apparatus of claim 1, further comprising bearing means for rotatably bearing said carrier, said bearing means being arranged centrally with respect to said annular treatment chamber.

15. The apparatus of claim 1, wherein said drive means is operatively connected at a bottom of said annular treatment chamber to drive said carrier.

16. The apparatus of claim 1, further comprising first bearing means for radially bearing said carrier, said first bearing means being arranged coaxially to a central axis of said annular treatment chamber and comprising second bearing means for axially bearing said carrier, said second bearing means being disposed one of radially outwards and inwards of said first bearing means.

17. The apparatus of claim 1, wherein said drive means is operatively coupled to said carrier at one of a central location with respect to a central axis of said annular treatment chamber and a radially distant location from said central axis, said drive means thereby being part of a bearing means for said carrier.

18. The apparatus of claim 1, wherein said carrier comprises a rotatable carrier plate, said carrier plate being formed so as to be elastically deformable.

19. The apparatus of claim 18, wherein said carrier plate has a spoked structure.

20. The apparatus of claim 19, wherein said carrier plate rests on bearing means along the periphery of said carrier plate.

21. The apparatus of claim 1, wherein said drive means for driving carrier act via a driving wheel on said carrier.

22. The apparatus of claim 1, wherein said carrier comprises additional workpiece carriers, said additional workpiece carriers being electrically isolated from other parts of said apparatus.

23. The apparatus of claim 22, wherein electrical source means are provided for selectively applying electrical potential to said isolated workpiece carriers.

24. The apparatus of claim 1, wherein said carrier means comprises means for holding said workpieces, said means for holding being movable along said annular treatment chamber at an equal distance from said inner surrounding wall and from said outer surrounding wall.

25. The apparatus of claim 1, wherein said carrier comprises means for carrying workpieces, said means for carrying being at floating electrical potential.

26. The apparatus of claim 1, wherein parts of at least two of said inner surrounding wall, outer surrounding wall, and of said carrier are electrically mutually isolated, so as to allow respective electrical potentials to be applied independently to said parts, and to generate one of a single plasma discharge between said parts at said inner surrounding wall and said parts at said outer surrounding wall, or a single plasma discharge between said parts at said inner surrounding wall and said parts at said carrier, or a single plasma discharge between said parts at said outer surrounding wall and said parts at said carrier, or two plasma discharges between said parts at said inner surrounding wall and said parts at said carrier and between said parts at said outer surrounding wall and said parts at said carrier.

27. The apparatus of claim 1, wherein said apparatus is a coating apparatus for said workpieces.

28. The apparatus of claim 1, wherein said workpieces are flat optical workpieces simultaneously treated on both of their flat sides.

29. The apparatus of claim 1, wherein said workpieces are flat optical workpieces being simultaneously and equally treated on both of their flat sides.

30. The apparatus of claim 1, wherein said treatment is a plasma polymerization coating treatment of optical workpieces.

* * * * *